United States Patent [19]
Hegblom et al.

[11] Patent Number: 6,148,016
[45] Date of Patent: Nov. 14, 2000

[54] INTEGRATED SEMICONDUCTOR LASERS AND PHOTODETECTORS

[75] Inventors: Eric R. Hegblom; Duane A. Louderback, both of Goleta, Calif.

[73] Assignee: The Regents of the University of California, Oakland, Calif.

[21] Appl. No.: 09/188,154

[22] Filed: Nov. 5, 1998

Related U.S. Application Data

[60] Provisional application No. 60/064,725, Nov. 6, 1997.

[51] Int. Cl.[7] ................ H01S 3/19; H01L 21/20
[52] U.S. Cl. ................ 372/50; 372/43; 372/99; 372/96; 372/102; 437/51; 437/129
[58] Field of Search ................ 372/43, 50, 92, 372/96, 98, 99, 102, 108, 109; 437/129, 51

[56] References Cited

U.S. PATENT DOCUMENTS

| | | | |
|---|---|---|---|
| 5,491,712 | 2/1996 | Lin et al. | 372/50 |
| 5,513,204 | 4/1996 | Jayaraman | 372/96 |
| 5,748,661 | 5/1998 | Kiely et al. | 372/50 |
| 5,751,757 | 5/1998 | Jiang et al. | 372/50 |
| 5,757,836 | 5/1998 | Jiang et al. | 372/50 |
| 5,757,837 | 5/1998 | Lim et al. | 372/50 |
| 5,801,402 | 9/1998 | Shin | 257/80 |
| 5,835,521 | 11/1998 | Ramdani et al. | 372/96 |
| 5,838,708 | 11/1998 | Lin et al. | 372/50 |
| 5,864,575 | 1/1999 | Ohiso et al. | 372/96 |
| 5,978,401 | 11/1999 | Morgan | 372/50 |
| 5,978,408 | 11/1999 | Thornton | 372/96 |
| 6,052,398 | 4/2000 | Brillouet et al. | 372/46 |

*Primary Examiner*—Brian Healy
*Attorney, Agent, or Firm*—John P. O'Banion

[57] ABSTRACT

A method for fabricating vertical cavity lasers and photodetectors on the same substrate from a single epitaxial layer to form integrated laser/photodetector structures. A DBR/cavity/DBR photodetector structure is formed on the substrate with the DBR on the input side of the photodetector being fabricated from relatively low index contrast, high refractive index semiconducting layers. Some of those same DBR layers on the input side of the photodetector are then converted from a low index contrast, high refractive index semiconducting material to a low refractive index material by, for example, etching the DBR/cavity/DBR structure down to the substrate layer and using lateral oxidation or etching, to form relatively high index contrast, high reflectivity mirrors for the laser.

21 Claims, 7 Drawing Sheets

INTEGRATED SEMICONDUCTOR LASERS AND PHOTODETECTORS

CROSS-REFERENCE TO RELATED APPLICATIONS

This application claims priority from U.S. provisional application Ser. No. 60/064,725 filed on Nov. 6, 1997, pending.

REFERENCE TO A MICROFICHE APPENDIX

Not Applicable

REFERENCES

The following documents, which may also be referenced in this specification using numbers in brackets (e.g., [1]), are incorporated herein by reference:

[1] J. Wasserbauer, J. Scott, S. Swirhun, D. Lewis, and P. Kazlas, "Integrated VCL/PIN Arrays for Optical Computing Applications," in Proc. LEOS Summer Topical Meeting, MD1 (23–24), 1997.

[2] H. Q. Hou, H. C. Chui, K. D. Choquette, B. E. Hammons, W. G. Breiland, and K. M. Geib, "Highly Uniform and Reproducible Vertical Cavity Surface-Emitting Lasers Grown by Metalorganic Vapor Phase Epitaxy with In-Situ Reflectometry," *Photon. Tech. Lett.*, vol. 8, pp. 1285–1287, 1996.

[3] M. H. MacDougal, G. M. Yang, A. E. Bond, C. K. Lin, D. Tishinin, and P. D. Dapkus, "Electrically-Pumped Vertical-Cavity Lasers with AlxOy-GaAs Reflectors," *Photon. Tech. Lett.*, vol. 8, pp. 310–312, 1996.

[4] E. M. Strzelecka, G. B. Thompson, G. D. Robinson, M. G. Peters, B. J. Thibeault, M. Mondry, V. Jayaraman, F. H. Peters, and L. A. Coldren, "Monolithic Integration of Refractive Lenses with Vertical Cavity Lasers and Detectors for Optical Interconnections," in Proc. SPIE Photonics West '96, paper no. 2691–07, 1996.

[5] S. F. Lim, G. S. Li, W. Yuen, and C. J. Chang-Hasnain, "Vertical Cavity Lasers with an Intracavity Resonant Detector," *IEEE J. Selected Topics in Quantum Electron.*, vol. 3, pp. 416–421, 1997.

STATEMENT REGARDING FEDERALLY SPONSORED RESEARCH OR DEVELOPMENT

This invention was made with Government support under Grant Nos. F30602-97-2-0122 and F49620-96-1-0342 awarded by the Air Force. The Government has certain rights in this invention.

BACKGROUND OF THE INVENTION

1. Field of the Invention

This invention pertains generally to semiconductor lasers and photodetectors and, more particularly, to a method for integrating semiconductor lasers and photodetectors on a substrate with a single epitaxial growth and structures that result therefrom.

2. Description of the Background Art

Semiconductor lasers have been used in long-distance (>km) commercial communication systems for over a decade. A well known example is what is referred to as an "in-plane" laser, because the light inside the laser travels parallel to the wafer on which the device is made. More recently, a different laser geometry has become popular for short distance (<100 m) data communications, such as between computers. These lasers are typically known as "vertical cavity surface emitting lasers" (VCSELs). A VCSEL emits light perpendicular to the wafer as the name implies. An advantage of VCSELs is that they are capable of being modulated at high speeds with much lower electrical power than in-plane lasers. In addition, the geometry of VCSELs makes them particularly suitable for making 2-D arrays, and for on-wafer testing. These characteristics can reduce the cost of packaging (which dominates the cost of manufacturing) and costs of the driver circuitry required.

Most VCSELs are "top emitting" devices; that is, light is emitted outward or away from the top surface of the device. However, bottom emitting devices where light is emitted through the substrate are advantageous for systems with arrays of vertical cavity lasers, because the driver circuitry can then be "flip-chip bonded" to the array instead of making individual wire bonds. Arrays of VCSELs may become important in the future to provide even higher speed data transmission links. Such transmission may take place not only between computers, but also within machines, in which case board-to-board and chip-to-chip data communication using VCSELs can be utilized. Processors such as the Intel Pentium II are already limited by the speed of data input and output. For faster data transfer, optical transmission becomes necessary because electrical lines become lossy at high speeds.

A vertical cavity laser comprises a substrate, a bottom mirror, a top mirror and a cavity with a gain medium between the top and bottom mirrors. The gain medium typically comprises quantum wells which, when electrically or optically pumped will emit light. The mirrors typically comprise distributed bragg reflectors (DBRs) formed from alternating high/low index quarter-wave thick layers. Multilayer stacks are generally used for the mirrors instead of metal due to the high reflectivity (>99%) needed to achieve lasing because the gain medium is so thin. Bottom-emitting or top-emitting VCSELs have a partially transmissive bottom or top mirror, respectively. Because of the highly reflectivity mirrors and short cavity used in VCSELs, the lasing wavelength is controlled by the resonant wavelength of the cavity, rather than the peak of the gain as in in-plane lasers. State of the art control of the growth of the cavity can set the wavelength to within ~±0.6% or a few nanometers for lasing wavelength around 1 $\mu$m [2]. For a typical bottom emitting vertical cavity laser, the bottom DBR transmission, $T_{bot}$, is <1% and the top DBR transmission, $T_{top}$, is <<$T_{bot}$.

A complete data link typically includes photodetectors as well as lasers. Vertical resonant cavity photodetectors typically comprise a substrate, a bottom DBR mirror, a top DBR or metal mirror, and a cavity with an electrically contacted absorbing medium between the top and bottom mirrors. The mirrors are required in order to be reasonably efficient at converting light into current, and the mirror of lower reflectivity defines the input side of the photodetector. For bottom illuminated photodetectors, where the light input is from the substrate side of the cavity, the wavelength of operation must be transparent to the substrate. In addition, the bottom DBR transmission, $T_{bot}$, is typically >5% and the top DBR transmission, $T_{top}$, is <$T_{bot}$.

Presently the substrates predominately used for VCSELs are GaAs because AlGaAs and GaAs are lattice matched to this substrate and have a relatively large refractive index difference as is needed for making high reflectivity DBR mirrors. However, materials which are lattice matched to GaAs and which absorb/emit at longer wavelengths than GaAs have not been found. Therefore, to obtain absorption/emission at wavelengths longer than GaAs, it is common to use thin, strained layers of InGaAs. By itself, such a thin region would only absorb a few percent of the incident light. In order to obtain a reasonable amount of absorption, mirrors are required to bounce the light many times through the absorbing region. With mirrors, the absorption increases, but at the expense of optical bandwidth. For bandwidths of a few nanometers or more, the input mirror reflectivity must be less than ~90%, which is much lower than the reflectivity required for a vertical cavity laser.

Packaging of a system of VCSELs and photodetectors, especially in the case of two-way communication, is much simpler and, therefore less costly, if the photodetectors and lasers can be positioned adjacent to each other on the same wafer. Then, connection of the circuits and optical alignment for both can be done at the same time. The extra costs associated with additional processing per device are typically much lower than packaging costs because the additional process steps for integration can be done on a full wafer of several thousand devices all at once whereas extra packaging steps must be done on each device separately. Integration of photodetectors and top-emitting VCSELs has been previously demonstrated [1], and integration is relatively simple. However, there is a need for side-by-side integration of bottom illuminated photodetectors which collect light through the substrate and bottom emitting VCSELs. The present invention quite beneficially achieves such needed integration so that the same epitaxial layer can be used in both devices.

BRIEF SUMMARY OF THE INVENTION

The present invention generally comprises a method for fabricating a vertical cavity laser adjacent to a resonant cavity photodetector on the same substrate wherein only one epitaxial layer is grown, as well as the integrated structures fabricated according to the method.

A vertical cavity laser typically requires high reflectivity mirrors (>99% reflection), whereas the input side of the resonant cavity photodetector typically requires much lower reflectivity (<95%). In order to satisfy those reflectivity requirements, an integrated laser/photodetector structure is fabricated on a single substrate according to the invention by first forming a conventional DBR/cavity/DBR photodetector structure on the substrate. The DBR on the input side of the photodetector is made from relatively low index contrast, high refractive index semiconducting layers. Some of those same DBR layers on the input side of the photodetector are then converted from a low index contrast, high refractive index semiconducting material to a low refractive index material by, for example, etching the DBR/cavity/DBR structure down to the substrate layer and using lateral oxidation or etching, to form relatively high index contrast, high reflectivity mirrors for the laser. While the primary intended use of this method is for integration of bottom emitting lasers and bottom illuminated photodetectors, the method can also be used for devices coupling light through the top or both the top and the bottom. Coupling light through the substrate, however, allows the devices to be flip-chip bonded to driver and/or receiver circuits, which is convenient for packaging arrays.

An object of the invention is to integrate semiconductor lasers and photodetectors so the same epitaxial layers can be used in both devices.

Another object of the invention is to integrate lasers and photodetectors which couple light in and out through the substrate.

Another object of the invention is to allow devices to be flip-chip bonded to electronics to avoid extra complexities which can arise when packaging dense arrays.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring to FIG. 1 through FIG. 11, where like reference numerals denote like elements or steps, the present invention comprises a method for side by side integration of vertical cavity lasers and photodetectors. While the invention is described herein with reference to integration of bottom emitting lasers with bottom illuminated photodetectors, it is also applicable to integration of top emitting lasers with top illuminated photodetectors, top emitting lasers with bottom illuminated photodetectors, and bottom emitting lasers with top illuminated photodetectors.

One method of integrating bottom emitting VCSELs and bottom illuminated photodetectors while, at the same time satisfying the following transmission requirements for the mirrors, laser: $T_{bot}<2\%$; $T_{top}<<T_{bot}$
photodetector: $T_{bot}>5\%$; $T_{top}<T_{bot}$,
is to grow the VCSEL layers over the entire substrate, etch away the VCSEL layers in certain areas, regrow the photodetector structure in the areas etched away, and finally remove the photodetector structure which was grown on top of the VCSEL layers. The present invention eliminates the need for such a complicated method by processing both devices together on the same substrate with a single epitaxial cavity growth.

Figure 1A:
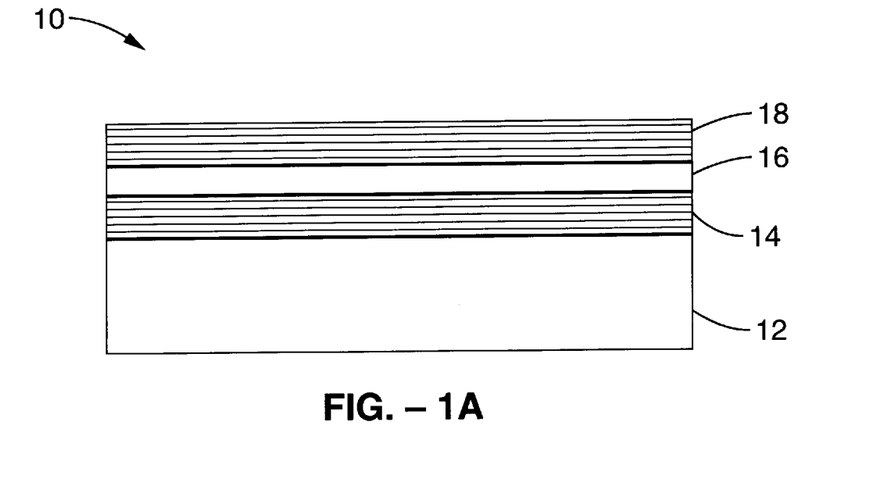
FIG. 1A is a schematic cross-sectional diagram showing an epitaxial structure in accordance with the present invention.
Figure 1B:
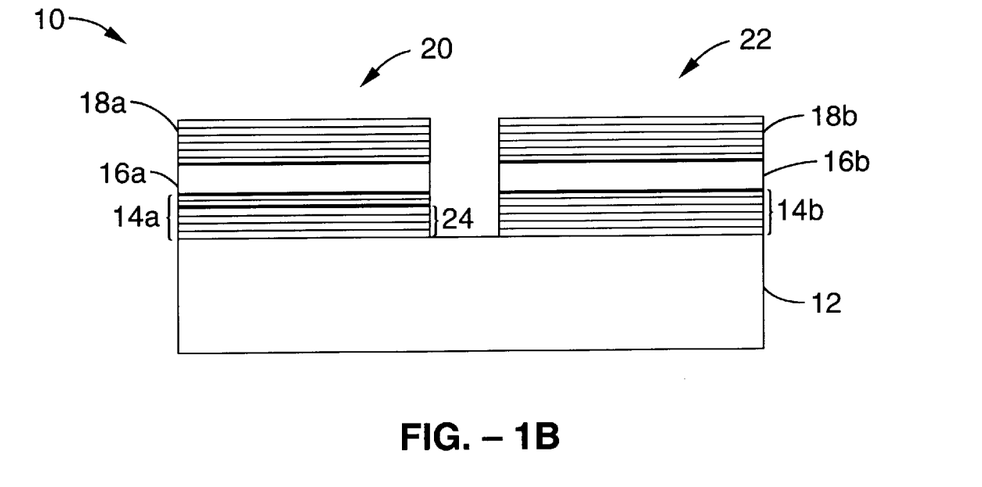
FIG. 1B is a schematic cross-sectional diagram showing formation of photodetector and laser cavities from original epitaxial growth in accordance with the present invention.

Referring first to FIG. 1A, in accordance with the present invention an epitaxial structure 10 comprising a substrate 12, a multilayered bottom DBR 14, a cavity 16 with an emission/absorption medium, and a multilayered top DBR 18, is fabricated in a conventional manner for fabricating vertical cavity devices. The bottom DBR 14 is formed as a relatively low index contrast, high refractive index semiconducting material. Referring next to FIG. 1B, the mirror/cavity/mirror layers in the epitaxial structure 10 shown in FIG. 1A are then separated, preferably by etching, into segments defining a VCSEL region 20 and a photodetector region 22 using conventional techniques such as wet chemical etching or reactive ion etching in conjunction with photolithography. As can be seen, therefore, substrate 12 now carries adjacent structures which, in combination, will ultimately become a device having an integrated VCSEL and photodetector. For example, VCSEL region comprises a bottom mirror segment 14a, a cavity segment 16a, and a top mirror segment 18a. Photodetector region 22 is similarly configured. Next, a portion 24 of the layers forming bottom DBR segment 14a in VCSEL region 20 are laterally etched or oxidized to achieve a lower refractive index, thus converting the DBR into the high index contrast, high reflectivity DBR necessary for the vertical cavity laser. The layers of the bottom DBR 14b in the adjacent photodetector region 22 of the structure, however, are left as grown so that their reflectivity remains low as required for the resonant cavity photodetector.

Figure 2:
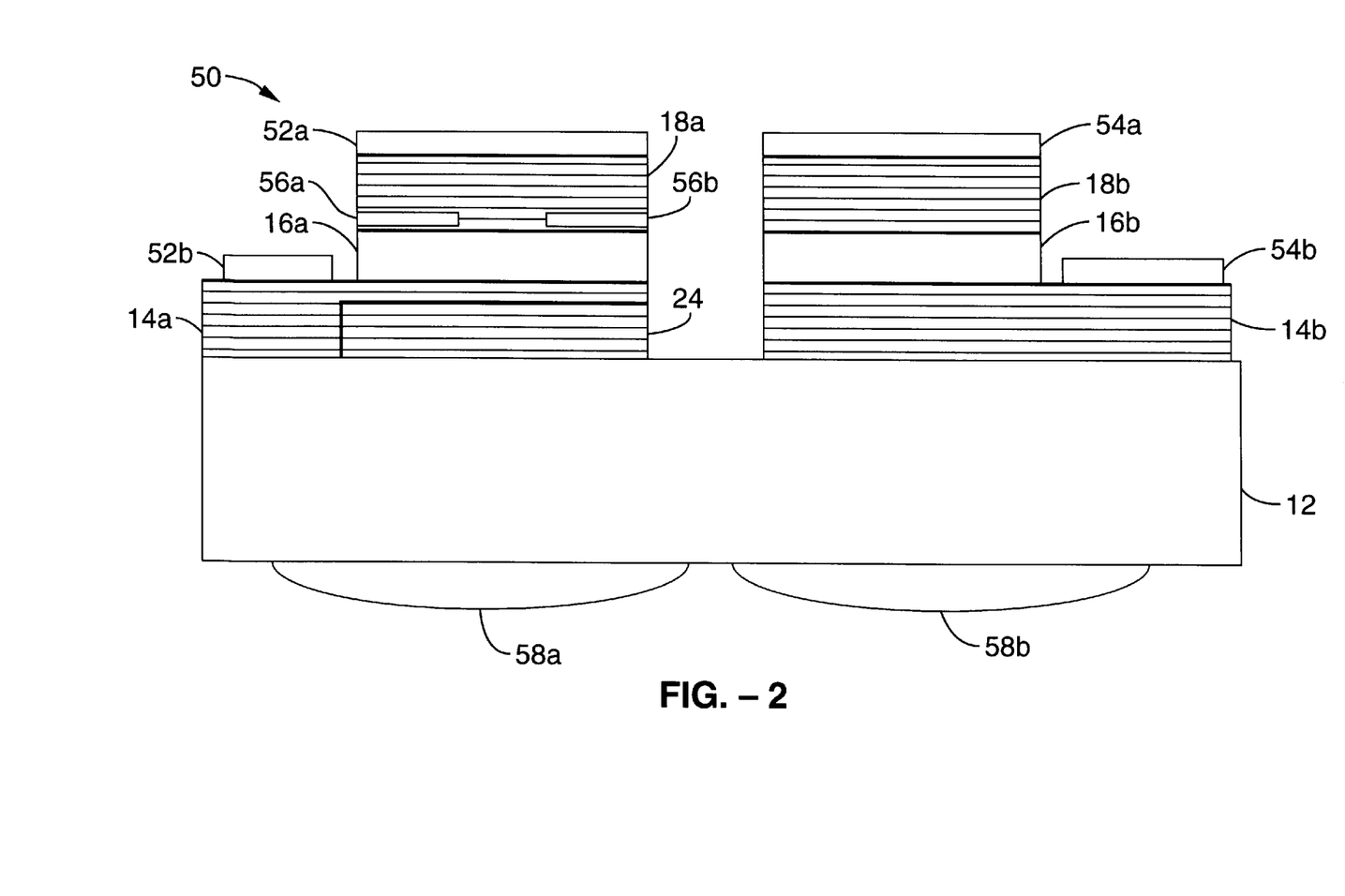
FIG. 2 is a schematic cross-sectional diagram showing a completed device in accordance with the present invention resulting from the process shown in FIG. 1A and FIG. 1B.

FIG. 2 shows a typical complete laser/photodetector device 50 fabricated according to the invention. This is essentially the structure shown in FIG. 1B, except that the laser and photodetector have been further processed for actual use. For example, metal contacts 52a, 52b have been added to the laser and metal contacts 54a, 54b have been added to the photodetector. Note also, the addition of air/oxide apertures 56a, 56b which are commonly used in conventional VCSELs for current/optical confinement. Such fabrication steps may be done before or in conjunction with the previously described steps to define the laser and photodetector regions. For example, the top metal electrical contacts may be deposited before the etching to separate the photodetector and the laser or the lateral oxidation of the layers in the bottom DBR may coincide with the formation of the oxide aperture. Also shown are optional integrated microlenses 58a, 58b on the substrate that can be used for collimating and/or focusing the laser beams.

It will be appreciated that an important element in the design of the layers is the resonant wavelength not only of the vertical cavity laser but also of the photodetector. Lateral oxidation of high aluminum content AlGaAs will convert it from a refractive index around 3.0 to an oxide with an index ~1.6, and such a technique has been used to make semiconductor/oxide DBR mirrors in a VCSEL [3]. Such a large change of index not only alters the reflectivity of the mirror, but also the phase, and so the resonant wavelength of the photodetector may be far from the resonant wavelength of the laser. A large change would not be desirable since wavelengths of the peak gain and the peak absorption are not far apart. In fact, under operating conditions (the laser under forward bias and the photodetector under reverse bias), the peaks may be separated by less than a nanometer.

Figure 3:
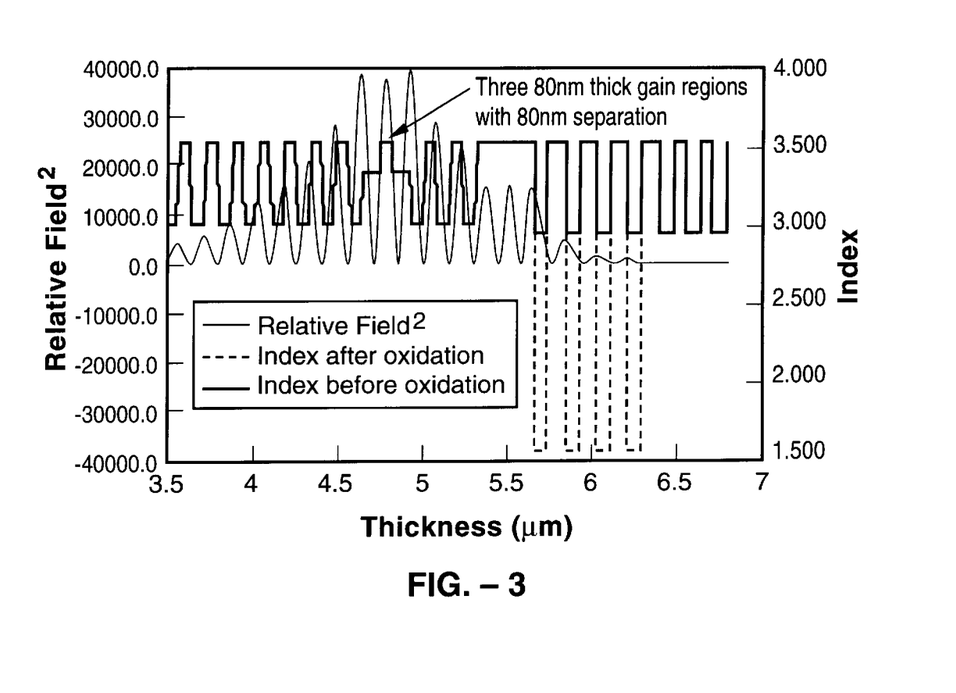
FIG. 3 is a graph of the vertical refractive index variation in a photodetector and the vertical cavity laser in accordance with the present invention and the relative transverse electric field squared as computed using the transmission matrix technique
Figure 4:
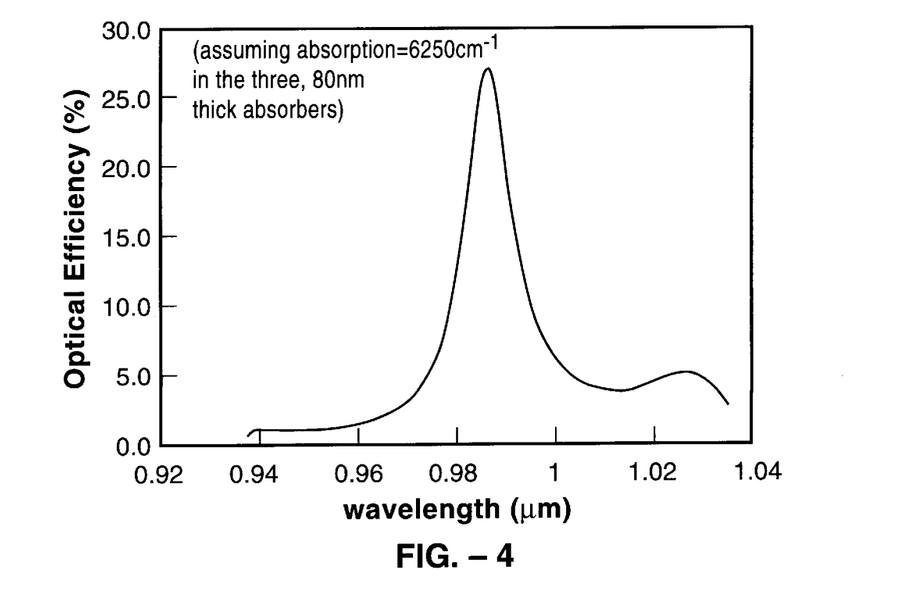
FIG. 4 is a graph depicting the optical efficiency of a photodetector in accordance with the present invention vs. wavelength.

Fortunately, it is possible to design the layer structure such that the resonant wavelength for both the laser and the photodetector are within a nanometer. FIG. 3 shows a graph of the vertical refractive index variation in the photodetector and the vertical cavity laser and the relative transverse electric field squared as computed using the transmission matrix technique. FIG. 3 shows only the first portion of the top DBR mirror. The remaining top periods have the same index variation as the first few. The exact index and thicknesses of the layers used are given in Table 1. Some parasitic absorption is assumed for the doped mirror layers. The four mirror periods containing layers which are converted to low index to make the laser consist of $\lambda/8$ low index and a $3\lambda/8$ high index layer. The thicker layer above the oxidized mirror periods is a $5\lambda/4$ layer of GaAs intended as an intracavity contact layer (since the oxide will not conduct current). The resonant wavelength for the photodetector is at 986.4 nm and the resonant wavelength for the laser is at 986.3 nm. Before, oxidation the bottom mirror has a transmission of 50% and, after oxidation, the transmission is reduced to 0.67%. When the oxide mirror is used, the material gain in the 8 nm thick quantum wells required for lasing is 1024 $cm^{-1}$ which is comparable to other working VCSELs. Using an absorption of 6250 $cm^{-1}$ (a typical value for $In_{0.2}Ga_{0.8}As$ around 980 nm) in the quantum wells, the optical efficiency of the photodetector is plotted vs. wavelength in FIG. 4. As can be seen, the photodetector has a bandwidth of ~12 nm, which is sufficiently broad to accommodate variations in the lasers wavelength. At resonance, the optical efficiency of the photodetector is 27%.

EXAMPLE 1

Figure 5:
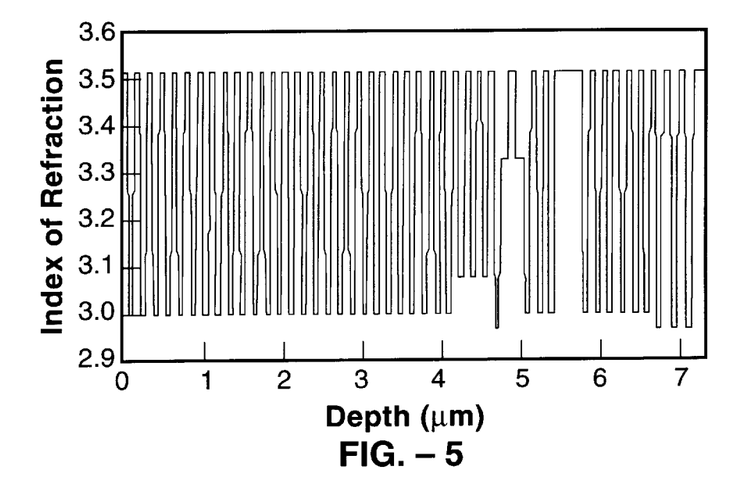
FIG. 5 is a graph showing the refractive index vs. depth for an entire structure that was grown by solid source molecular beam epitaxy in accordance with the present invention.
Figure 6:
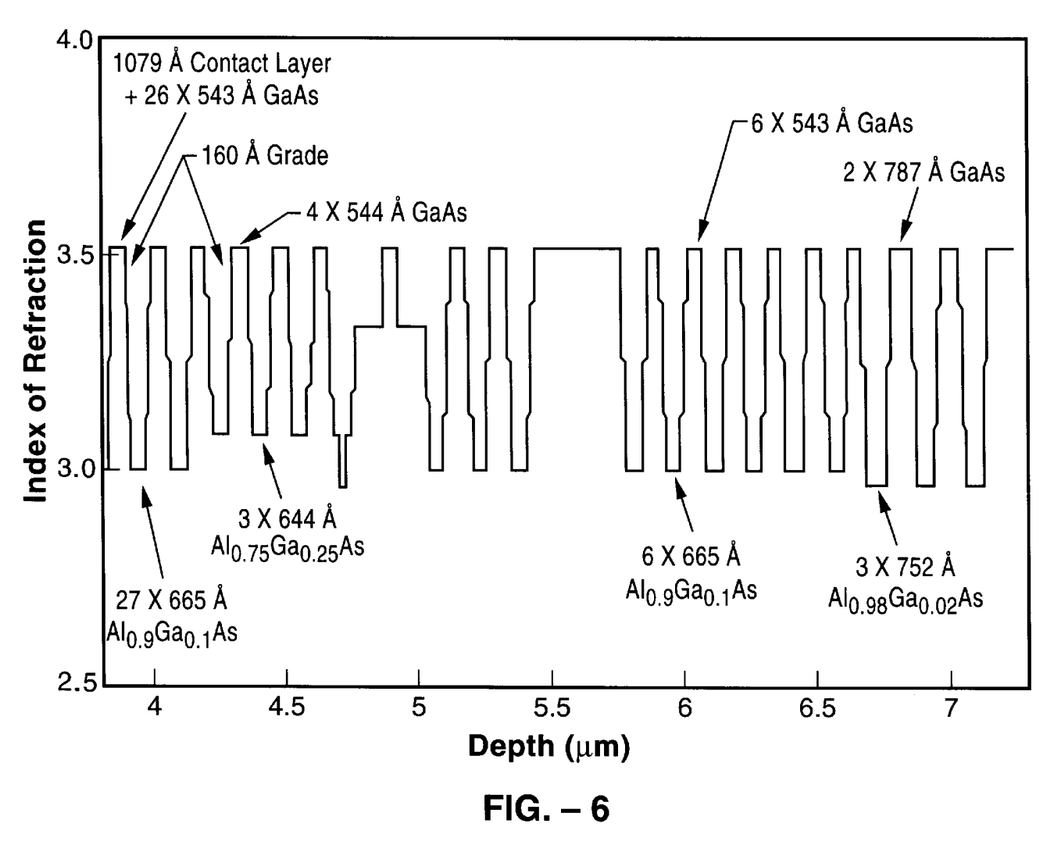
FIG. 6 is a graph showing the refractive index vs. depth for a region of interest in a structure that was grown by solid source molecular beam epitaxy in accordance with the present invention.

We have used the method previously described to fabricate substrate-emitting vertical cavity lasers and substrate-illuminated resonant cavity photodetectors out of the same epitaxial layers without regrowth. FIG. 5 and FIG. 6 show plots of the refractive index versus depth in a structure that was grown by solid source molecular beam epitaxy. This structure included three layers that were to be oxidized for the VCLs, but not for the photodetectors. Originally the three layers were $Al_{0.98}Ga_{0.02}As$ having a refractive index of 2.98. After oxidation, the index of these layers was reduced to ~1.55, increasing the reflectivity of the DBR mirror and allowing the device to lase.

Figure 7:
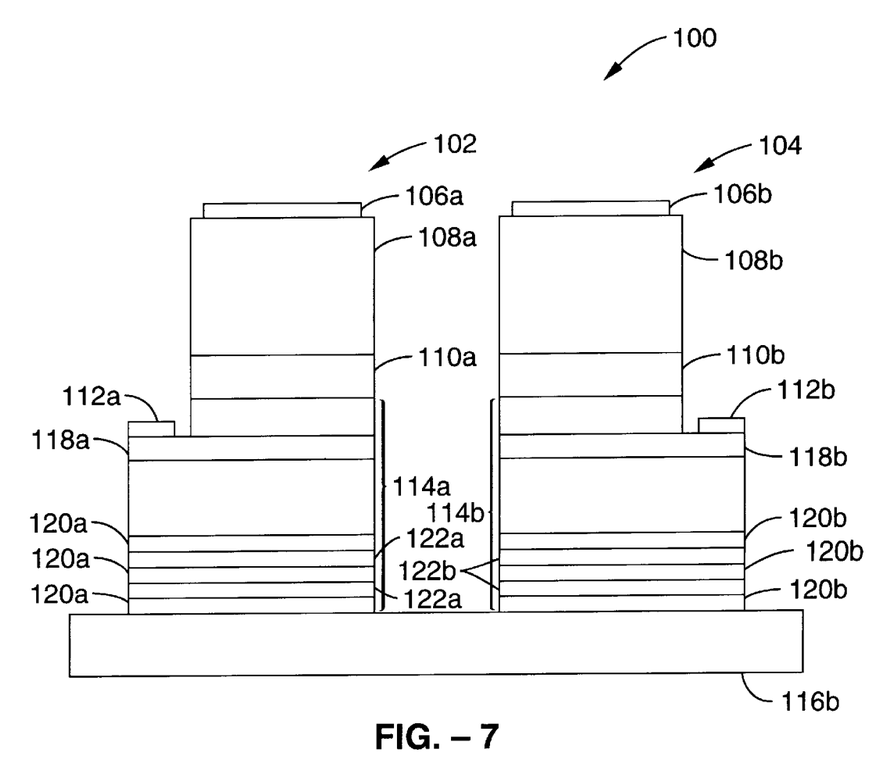
FIG. 7 is a schematic diagram of an integrated structure fabricated in accordance with the present invention.

FIG. 7 shows a schematic representation of an integrated structure 100 that was fabricated to provide a VCSEL 102 and a vertical resonant cavity photodetector 104. As shown in FIG. 7, the structure includes p-contacts 106a, 106b, top DBR's 108a, 108b, cavities 110a, 100b with quantum wells, n-contacts 112a, 112b, and bottom DBR's 114a, 114b, all of which are supported by a Si GaAs substrate base 116. Also shown are n+GaAs contact layers 118a, 118b for the bottom DBR's 114a, 114b, respectively. Note that each of the cavities 110a, 110b comprises three InGaAs quantum wells. These quantum wells serve to emit light (in the laser) and collect light (in the photodetector) as commonly incorporated in vertical cavity lasers and resonant cavity photodetectors which are not integrated. Layers above the quantum wells are p-doped and layers below the quantum wells are n-doped as is common in vertical cavity lasers and resonant cavity photodetectors which are not integrated. Also shown are the oxidized 120a and unoxidized 120b $Al_{0.98}Ga_{0.02}As$ layers that distinguish the bottom DBR 114a for the laser 102 from the bottom DBR 114b for the photodetector 104, as well as intermediate GaAs layers 122a, 122b.

The first step in processing was the deposition of the p-contacts 106a, 106b. Next mesas around the p-contacts were formed using conventional reactive ion etching. The etching was stopped at the n+GaAs layers 118a, 118b as shown in FIG. 7. The n-contacts 112a, 112b were then deposited. Next the p-contact, the mesa on which its sits, and n-contacts were protected with photoresist during an etch in order to expose the layers of $Al_{0.98}Ga_{0.02}As$, thus creating the double mesa structures shown in FIG. 7. SiN was then deposited around the layers 120b of $Al_{0.98}Ga_{0.02}As$ in the photodetector in order to protect them from the lateral oxidation that followed. Preferably, such protection could be avoided by making the lower mesa of the photodetector much larger in order that the lateral oxidation does not extend underneath the photodetector. The layers 120a of $Al_{0.98}Ga_{0.02}As$ layers under the vertical cavity laser were then oxidized in a manner similar to that described in [3] in order to create the high reflectivity mirror necessary for lasing.

Figure 8:
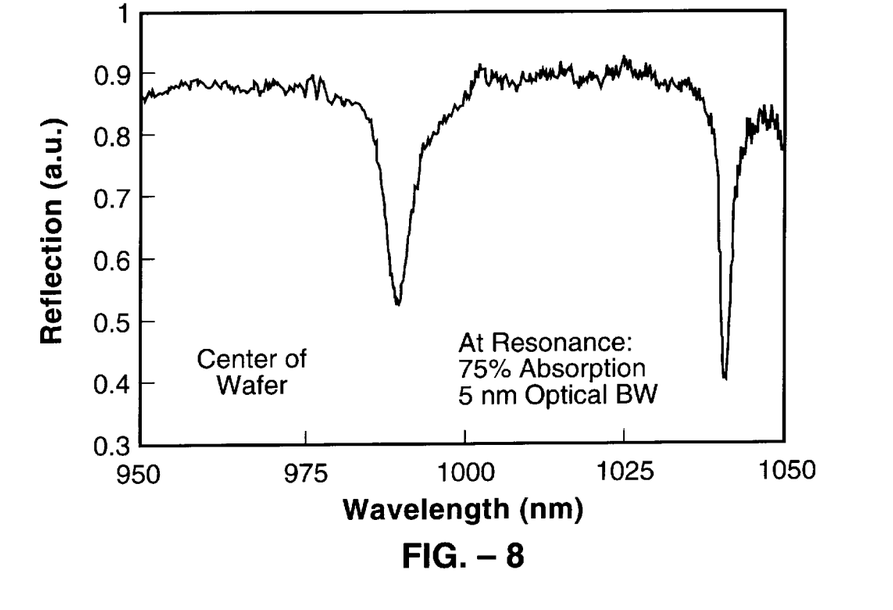
FIG. 8 is a graph showing the reflection spectra of a wafer grown in accordance with the present invention.
Figure 9:
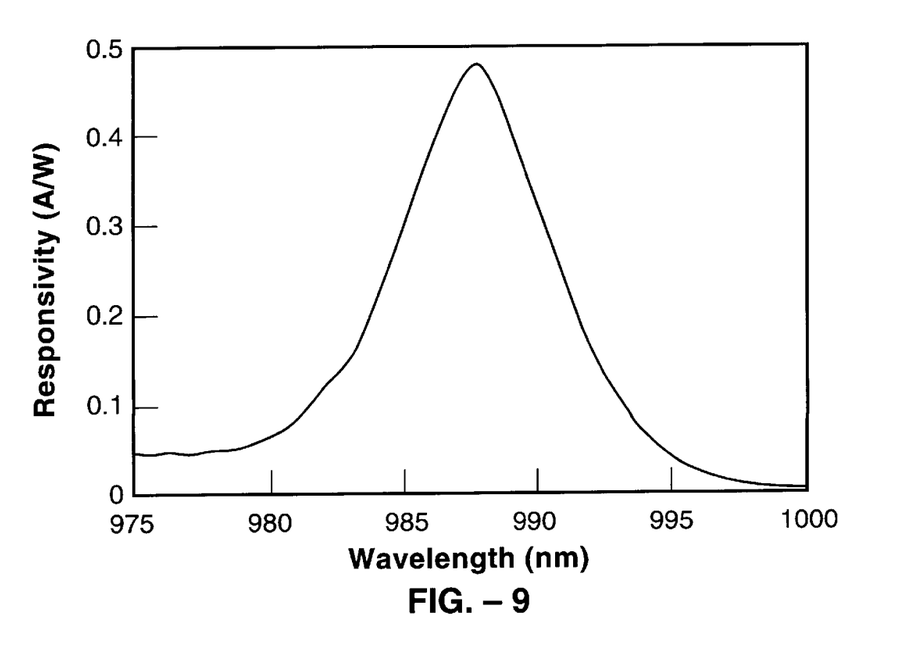
FIG. 9 is a graph showing responsivity vs. wavelength for a photodetector fabricated in accordance with the present invention.
Figure 10:
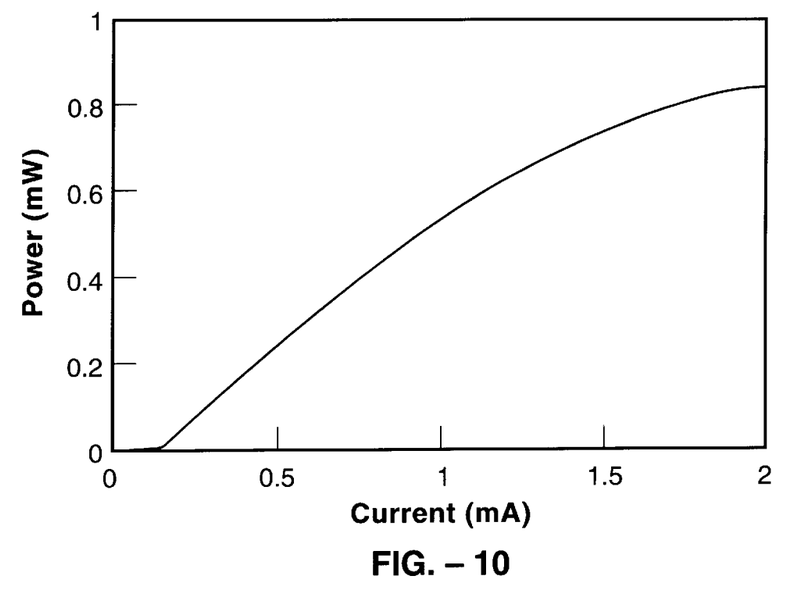
FIG. 10 is a graph showing optical power and voltage vs. current characteristics for a vertical laser fabricated in accordance with the present invention.
Figure 11:
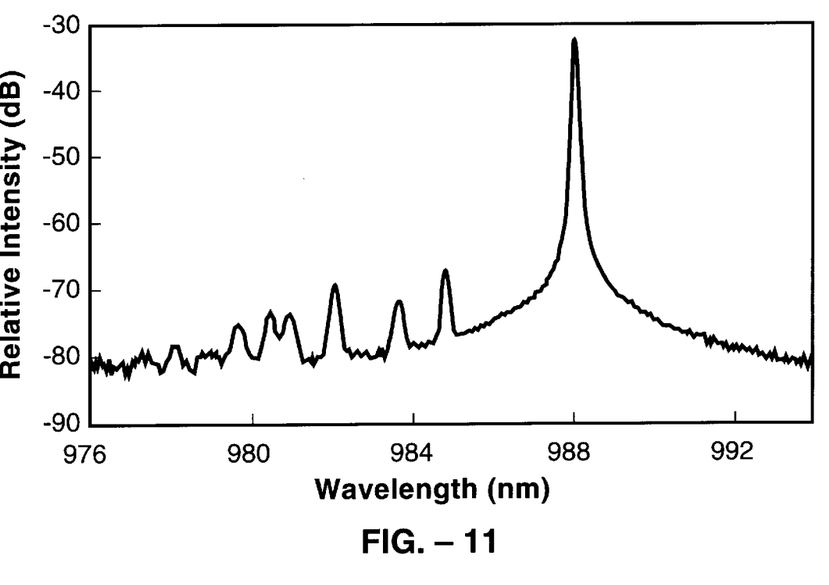
FIG. 11 is a graph showing the spectra of a vertical laser fabricated in accordance with the present invention.

FIG. 8 and FIG. 9 show the results from photodetector characterization. In FIG. 8, the reflection spectra of the wafer as grown is shown. This spectra is close to what was predicted by modeling. FIG. 9 shows the photodetector's responsivity versus wavelength, which is also close to what was predicted. Such responsivity is too high to come from a reversed biased vertical cavity laser, thus demonstrating the benefits of this novel integration scheme. FIG. 10 and FIG. 11 show the results from the vertical cavity laser (VCL) characterization. FIG. 10 shows the laser's optical power versus current characteristics. FIG. 11 shows the laser's spectra, which is single-mode due to the small size of the device. The narrow peak in the laser's spectra and the high current to light efficiency indicate that lasing is occurring. Note the lasing wavelength is within a nanometer of the peak response of the photodetector.

It will be appreciated that various alternative embodiments of the invention are possible. For example, the top mirror need not be semiconducting material, the active region may use other materials, or the exact grading and doping may be different. These variations are already common among vertical cavity laser designs in the literature. Therefore, although the description above contains many specificities, these should not be construed as limiting the scope of the invention but as merely providing illustrations of some of the presently preferred embodiments of this invention. Thus the scope of this invention should be determined by the appended claims and their legal equivalents.

TABLE 1

| Layer | Thickness | n | k |
|---|---|---|---|
| Incident |  | 0.1740 | 5.6900 |
| 1 | 455.6 | 3.518 | 4.333e − 04 |
| 2 | 636.0 | 3.518 | 8.666e − 05 |
| 3 | 45.0 | 3.389 | 8.666e − 05 |
| 4 | 45.0 | 3.261 | 8.666e − 05 |
| 5 | 45.0 | 3.132 | 8.666e − 05 |
| Repeated 29 times { |  |  |  |
| 6 | 689.2 | 3.003 | 8.666e − 05 |
| 7 | 45.0 | 3.132 | 8.666e − 05 |
| 8 | 45.0 | 3.261 | 8.666e − 05 |
| 9 | 45.0 | 3.389 | 8.666e − 05 |
| 10 | 568.5 | 3.518 | 1.733e − 04 |
| 11 | 45.0 | 3.389 | 8.666e − 05 |
| 12 | 45.0 | 3.261 | 8.666e − 05 |
| 13 | 45.0 | 3.132 | 8.666e − 05 |

TABLE 1-continued

| Layer | Thickness | n | k |
|---|---|---|---|
| } |  |  |  |
| 238 | 696.7 | 3.003 | 4.333e − 05 |
| 239 | 120.0 | 3.167 | 4.333e − 05 |
| 240 | 674.8 | 3.330 | 4.333e − 05 |
| 241 | 120.0 | 2.952 | 4.333e − 05 |
| 242 | 314.8 | 3.330 | 4.333e − 05 |
| 243 | 80.0 | 3.518 | 0.000e + 00 |
| 244 | 80.0 | 3.518 | (layer with gain/absorption) |
| 245 | 80.0 | 3.518 | 0.000e + 00 |
| 246 | 80.0 | 3.518 | (layer with gain/absorption) |
| 247 | 80.0 | 3.518 | 0.000e + 00 |
| 248 | 80.0 | 3.518 | (layer with gain/absorption) |
| 249 | 100.0 | 3.518 | 0.000e + 00 |
| 250 | 1119.5 | 3.330 | 3.939e − 05 |
| 251 | 100.0 | 3.261 | 3.939e − 05 |
| 252 | 694.2 | 3.003 | 3.939e − 05 |
| 253 | 53.3 | 3.132 | 1.970e − 04 |
| 254 | 53.3 | 3.261 | 1.970e − 04 |
| 255 | 53.3 | 3.389 | 1.970e − 04 |
| Incident repeated 2 times { |  |  |  |
| 256 | 543.5 | 3.518 | 3.939e − 05 |
| 257 | 53.3 | 3.389 | 1.970e − 04 |
| 258 | 53.3 | 3.261 | 1.970e − 04 |
| 259 | 53.3 | 3.132 | 1.970e − 04 |
| 260 | 664.2 | 3.003 | 3.939e − 05 |
| 261 | 53.3 | 3.132 | 1.970e − 04 |
| 262 | 53.3 | 3.261 | 1.970e − 04 |
| 263 | 53.3 | 3.389 | 1.970e − 04 |
| } |  |  |  |
| 272 | 3437.5 | 3.518 | 7.878e − 05 |
| Repeated 4 times { |  |  |  |
| 273 | 798.4 | 1.550 | 0.000e + 00 (Layer with low index after oxidation/etching) |
| 274 | 1055.2 | 3.518 | 0.000e + 00 |
| } |  |  |  |
| Repeated 2 times { |  |  |  |
| 281 | 838.3 | 2.952 | 0.000e + 00 |
| 282 | 703.5 | 3.518 | 0.000e + 00 |
| } |  |  |  |
| 285 | 838.3 | 2.952 | 0.000e + 00 |
| Exit |  | 3.5182 | 0.0000e + 00 |

Overall thickness 6.79381 um

What is claimed is:

1. A method for fabricating a vertical cavity laser adjacent to a vertical cavity photodetector, comprising the steps of:
   (a) forming an epitaxial structure comprising a substrate, a first mirror, a second mirror, and an emission/absorption cavity between said first and second mirrors;
   (b) separating said first mirror, said second mirror and said cavity into segments defining an emitting region and a detecting region; and
   (c) lowering the refractive index of a mirror segment in said emitting region.

2. A method as recited in claim 1, wherein said mirrors comprise distributed bragg reflectors.

3. A method as recited in claim 1, wherein said first mirror comprises a low index contrast, high refractive index distributed bragg reflector, and the refractive index of a mirror segment formed from said first mirror is lowered to create a high index contrast, high reflectivity mirror segment.

4. An integrated vertical cavity laser and photodetector fabricated according to a method as recited in claim 1.

5. An integrated vertical cavity laser and photodetector fabricated according to a method as recited in claim 1, wherein said emitting region comprises a bottom emitting laser and said detecting region comprises a bottom illuminated photodetector.

6. An integrated vertical cavity laser and photodetector fabricated according to a method as recited in claim 1, wherein said emitting region comprises a top emitting laser and said detecting region comprises a top illuminated photodetector.

7. A method for fabricating a vertical cavity laser adjacent to a vertical cavity photodetector, comprising the steps of:
   (a) forming a first mirror on a substrate;
   (b) forming an emission/absorption cavity on said first mirror;
   (c) forming a second mirror on said cavity;
   (d) separating said first mirror, said second mirror and said cavity into segments defining an emitting region and a detecting region; and
   (e) lowering the refractive index of a mirror segment in said emitting region.

8. A method as recited in claim 7, wherein said mirrors comprise distributed bragg reflectors.

9. A method as recited in claim 7, wherein said first mirror comprises a low index contrast, high refractive index distributed bragg reflector, and the refractive index of a mirror segment formed from said first mirror is lowered to create a high index contrast, high reflectivity mirror segment.

10. An integrated vertical cavity laser and photodetector fabricated according to a method as recited in claim 7.

11. An integrated vertical cavity laser and photodetector fabricated according to a method as recited in claim 7, wherein said emitting region comprises a bottom emitting laser and said detecting region comprises a bottom illuminated photodetector.

12. An integrated vertical cavity laser and photodetector fabricated according to a method as recited in claim 7, wherein said emitting region comprises a top emitting laser and said detecting region comprises a top illuminated photodetector.

13. A method for fabricating a vertical cavity laser adjacent to a vertical cavity photodetector, comprising the steps of:
   (a) forming on a substrate, a multilayered structure comprising a low index contrast, high refractive index first mirror, a second mirror, and an emission/absorption cavity between said first and second mirrors;
   (b) separating said multilayered structure into an emitting region and a detecting region, each said region comprising a first mirror segment, a second mirror segment and a cavity segment between said mirror segments; and
   (c) lowering the refractive index of said first mirror segment in said emitting region to create a high index contrast, high reflectivity mirror segment.

14. A method as recited in claim 13, wherein said mirrors comprise distributed bragg reflectors.

15. An integrated vertical cavity laser and photodetector fabricated according to a method as recited in claim 13.

16. An integrated vertical cavity laser and photodetector fabricated according to a method as recited in claim 13, wherein said emitting region comprises a bottom emitting laser and said detecting region comprises a bottom illuminated photodetector.

17. An integrated vertical cavity laser and photodetector fabricated according to a method as recited in claim 13, wherein said emitting region comprises a top emitting laser and said detecting region comprises a top illuminated photodetector.

18. A method for fabricating a vertical cavity laser adjacent to a vertical cavity photodetector, comprising the steps of:
   (a) forming an epitaxially grown structure comprising a substrate, a first mirror, a second mirror, and an emission/absorption cavity between said first and second mirrors;
   (b) at least one of said mirrors comprising a low index contrast, high refractive index distributed bragg reflector;
   (c) separating said first mirror, said second mirror and said cavity into segments defining an emitting region and a detecting region; and
   (d) lowering the refractive index of said at least on of said mirror segments defined by said low index contrast, high refractive index distributed bragg reflector to create a high index contrast, high reflectivity distributed bragg reflector segment.

19. An integrated vertical cavity laser and photodetector fabricated according to a method as recited in claim 18.

20. An integrated vertical cavity laser and photodetector fabricated according to a method as recited in claim 18, wherein said emitting region comprises a bottom emitting laser and said detecting region comprises a bottom illuminated photodetector.

21. An integrated vertical cavity laser and photodetector fabricated according to a method as recited in claim 18, wherein said emitting region comprises a top emitting laser and said detecting region comprises a top illuminated photodetector.

* * * * *